United States Patent
Lai et al.

(10) Patent No.: US 9,136,277 B2
(45) Date of Patent: Sep. 15, 2015

(54) THREE DIMENSIONAL STACKED SEMICONDUCTOR STRUCTURE AND METHOD FOR MANUFACTURING THE SAME

(71) Applicant: Macronix International Co., Ltd., Hsinchu (TW)

(72) Inventors: Erh-Kun Lai, Taichung (TW); Yen-Hao Shih, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 231 days.

(21) Appl. No.: 13/652,701

(22) Filed: Oct. 16, 2012

(65) Prior Publication Data

US 2014/0103530 A1   Apr. 17, 2014

(51) Int. Cl.
*H01L 27/115* (2006.01)
*H01L 21/768* (2006.01)
*H01L 23/522* (2006.01)

(52) U.S. Cl.
CPC .... *H01L 27/11575* (2013.01); *H01L 21/76805* (2013.01); *H01L 21/76831* (2013.01); *H01L 21/76877* (2013.01); *H01L 21/76889* (2013.01); *H01L 27/11548* (2013.01); *H01L 23/5226* (2013.01); *H01L 27/11556* (2013.01); *H01L 27/11582* (2013.01)

(58) Field of Classification Search
CPC ............ H01L 27/11575; H01L 27/11548; H01L 27/11556; H01L 27/11582; H01L 23/5226
USPC ........................................................ 257/758
See application file for complete search history.

(56) References Cited

U.S. PATENT DOCUMENTS

| | | | |
|---|---|---|---|
| 5,398,200 A | 3/1995 | Mazure et al. | |
| 5,554,870 A | 9/1996 | Fitch et al. | |
| 8,173,987 B2 | 5/2012 | Lung | |
| 8,372,732 B2 * | 2/2013 | Kim | 438/478 |
| 8,486,791 B2 | 7/2013 | Lue | |
| 8,503,213 B2 | 8/2013 | Chen et al. | |
| 8,574,992 B2 | 11/2013 | Chen et al. | |
| 8,759,899 B1 | 6/2014 | Lue et al. | |
| 8,829,646 B2 | 9/2014 | Lung et al. | |

(Continued)

OTHER PUBLICATIONS

Non-Final Office Action for U.S. Appl. No. 14/143,040, filed Dec. 30, 2013, mailed Apr. 3, 2015.

*Primary Examiner* — Matthew W Such
*Assistant Examiner* — Krista Soderholm
(74) *Attorney, Agent, or Firm* — McClure, Qualey & Rodack, LLP

(57) ABSTRACT

A three dimensional stacked semiconductor structure comprises a stack including plural oxide layers and conductive layers arranged alternately, at least a contact hole formed vertically to the oxide layers and the conductive layers, and extending to one of the conductive layers, an insulator formed at the sidewall of the contact hole, a conductor formed in the contact hole and connecting the corresponding conductive layer, and the corresponding conductive layer comprises a silicide. The silicide could be formed at edges or an entire body of the corresponding conductive layer. Besides the silicide, the corresponding conductive layer could, partially or completely, further comprise a conductive material connected to the conductor. The corresponding conductive layer which the contact hole extends to has higher conductivity than other conductive layers. Also, the 3D stacked semiconductor structure could be applied to a fan-out region of a 3D flash memory.

21 Claims, 7 Drawing Sheets

(56) References Cited

U.S. PATENT DOCUMENTS

| | | |
|---|---|---|
| 2008/0094873 A1 | 4/2008 | Lai et al. |
| 2011/0059595 A1 | 3/2011 | Jung |
| 2011/0280077 A1 | 11/2011 | Fishburn |
| 2012/0205722 A1* | 8/2012 | Lee et al. .............. 257/211 |
| 2012/0276696 A1 | 11/2012 | Yang et al. |
| 2013/0043509 A1 | 2/2013 | Cho et al. |
| 2013/0127011 A1 | 5/2013 | Higashitani et al. |
| 2013/0164922 A1 | 6/2013 | Cho et al. |
| 2013/0229846 A1 | 9/2013 | Chien et al. |
| 2013/0328005 A1 | 12/2013 | Shin et al. |
| 2014/0103530 A1 | 4/2014 | Lai et al. |
| 2014/0151627 A1 | 6/2014 | Hong et al. |
| 2014/0151774 A1 | 6/2014 | Rhie |
| 2014/0166963 A1 | 6/2014 | Lee |
| 2014/0246716 A1 | 9/2014 | Sinha |
| 2015/0084204 A1 | 3/2015 | Yun et al. |

* cited by examiner

THREE DIMENSIONAL STACKED SEMICONDUCTOR STRUCTURE AND METHOD FOR MANUFACTURING THE SAME

BACKGROUND

1. Field of the Invention

The disclosure relates in general to a three-dimensional (3D) stacked semiconductor structure and method of manufacturing the same, and more particularly to the 3D stacked semiconductor structure in a fan-out region of a 3D flash memory and method of manufacturing the same.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed.

With the development of size reduction of device, the distance between gates in the array region of the three-dimensional (3D) stacked flash memory structure is reduced consequently. Take a 3D NAND-type flash memory structure as an example. Without ion implant, the junctions between the gates still occur after voltage applies to the structure (so called as a 3D stacked junction-free NAND structure). FIG. 1 is a perspective view of part of a 3D stacked NAND flash memory. The 3D stacked NAND flash memory includes an array region 11 and a fan-out region 13. The 3D stacked semiconductor structure in the fan-out region 13 comprises a stack of several oxide layers 131 and polysilicon layers 133 (as gate material) arranged alternately. The contact holes 135 is formed vertically to the stack and filled with conductors for connecting each of the conductive layers to outer circuits. However, the resistances of the polysilicon layers 133 in the fan-out region 13 have to be decreased by ion implanting. High resistances of the polysilicon layers 133 would have considerable effect on the programming speed (e.g. read latency) of the 3D stacked flash memory, such as causing response delay or even out of operation. Currently, the polysilicon layers 133 in the fan-out region 13 are ion implanted layer by layer, which is time-consuming and expansive.

SUMMARY

The disclosure relates to a three-dimensional (3D) stacked semiconductor structure and method of manufacturing the same. The resistance of the 3D stacked semiconductor structure could be effectively reduced by simple manufacturing procedures provided in the embodiments, and the operation speed of the structure is consequently increased. Accordingly, the 3D stacked semiconductor structure provided in the embodiments have low production cost due to simple and quick manufacturing steps, and the applied memory possesses improved speed, and high and stable performance.

According to one embodiment of the present disclosure, a 3D stacked semiconductor structure is provided, comprising a stack including plural oxide layers and conductive layers arranged alternately, at least a contact hole formed vertically to the oxide layers and the conductive layers, and the contact hole extending to one of the conductive layers, an insulator formed at the sidewall of the contact hole, a conductor formed in the contact hole and connecting the corresponding conductive layer, and the corresponding conductive layer comprises a silicide. The silicide could be formed at edges or an entire body of the corresponding conductive layer. Besides the silicide, the corresponding conductive layer of the embodiments could further, partially or completely, comprise a conductive material (as a conducting substance) connected to the conductor. The corresponding conductive layer which the contact hole extends to has higher conductivity than other conductive layers.

According to one embodiment of the present disclosure, a method of forming 3D stacked semiconductor structure is provided, comprising steps of forming a plurality of oxide layers and a plurality of conductive layers arranged alternately; forming at least a contact hole vertically to the oxide layers and the conductive layers, and the contact hole extending to one of the conductive layers; forming an insulator at sidewall of the contact hole; forming a conductor in the contact hole, and the conductor connecting the corresponding conductive layer which the contact hole extends to; and at least forming a silicide at one portion of corresponding conductive layer which the contact hole extends to. The corresponding conductive layer which the contact hole extends to has higher conductivity than other conductive layers. In the embodiments, the silicide could be formed before or after forming the contact hole and the insulator.

The disclosure will become apparent from the following detailed description of the preferred but non-limiting embodiments. The following description is made with reference to the accompanying drawings.

DETAILED DESCRIPTION

In the embodiments of the present disclosure, a three-dimensional (3D) stacked semiconductor structure and method of manufacturing the same are provided. The 3D stacked semiconductor structure of the embodiments possess the reduced resistance, particularly the resistance of bit lines which the operation current passes through, thereby effectively increasing the speed of the 3D flash memory of application. Also, the 3D stacked semiconductor structure of the embodiments are manufactured by simple process, and adopting no time-consuming and expensive procedures such as several ion-implant procedures. Accordingly, the 3D stacked semiconductor structure provided in the embodiments have low production cost due to simple and quick manufacturing steps, and the applied memory possesses improved speed, and high and stable performance.

The embodiments below are disclosed for elaborating the 3D stacked semiconductor structures of the disclosure and method of manufacturing the same. However, the descriptions disclosed in the embodiments of the disclosure such as detailed structures, manufacturing procedures and material selections are for illustration only, not for limiting the scope of protection of the disclosure. Also, the embodiments could be applied to, but not limited to, a 3D flash memory, such as applied in a fan-out region of a 3D NAND flash memory. The embodiments could be applied to floating gate memory, charge trapping memory, and the applications further extend to non-volatile memory and embedded memory.

Figure 1:
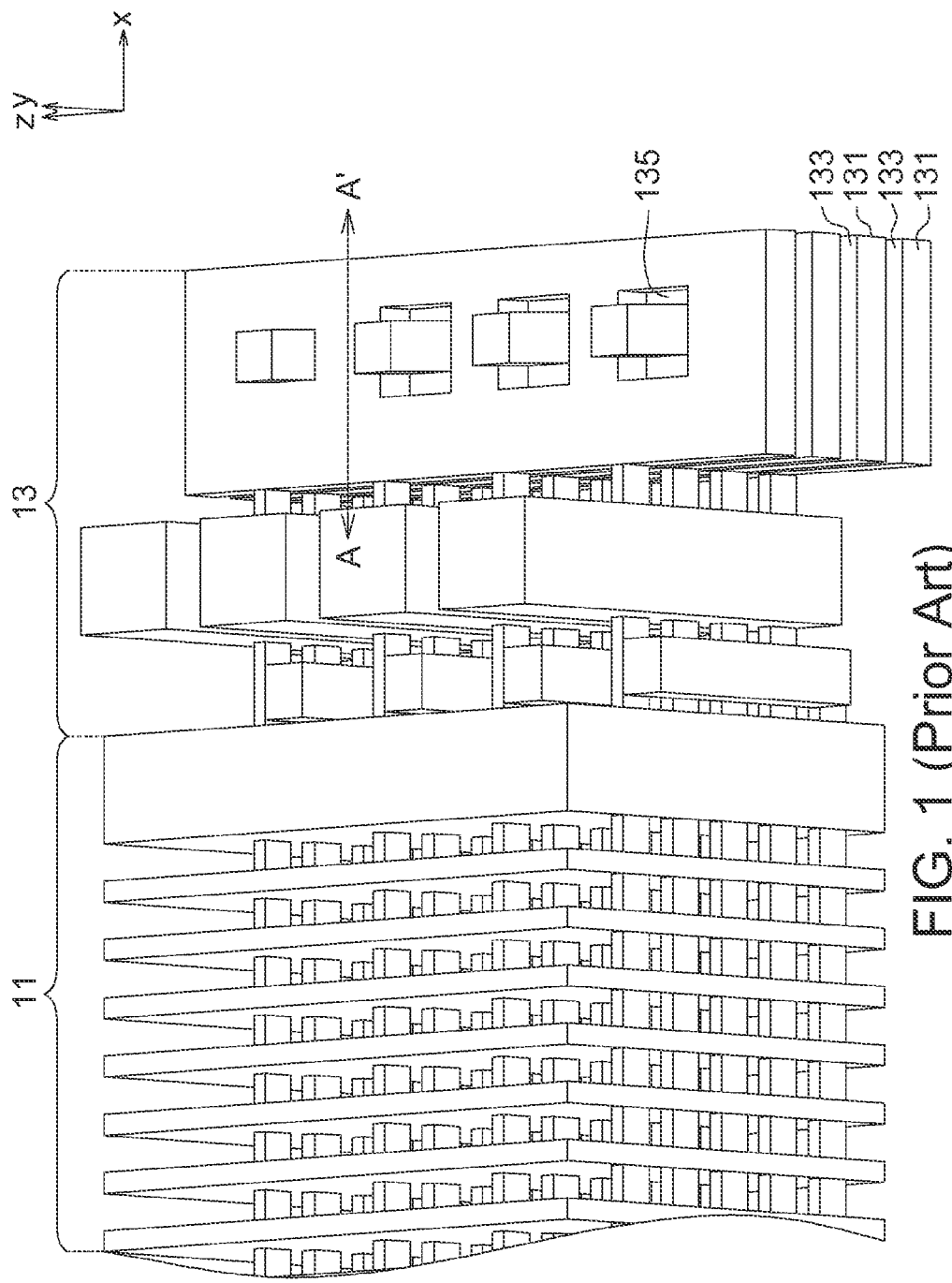
FIG. 1 (prior art) is a perspective view of part of a 3D stacked NAND flash memory.
Figure 2:
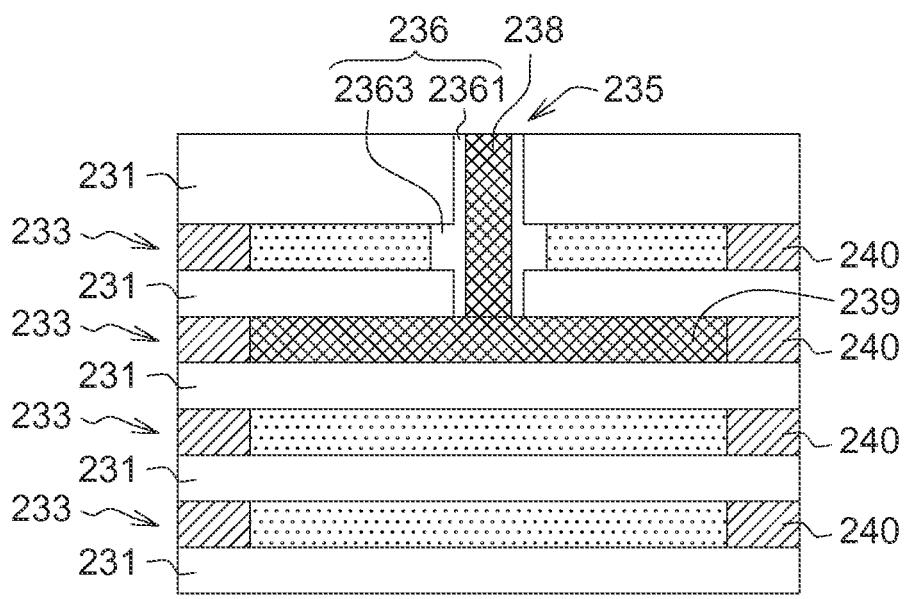
FIG. 2 is a cross-sectional view of a 3D stacked semiconductor structure according to the embodiment of the present disclosure.

FIG. 2 is a cross-sectional view of a 3D stacked semiconductor structure according to the embodiment of the present disclosure. The cross-sectional view of the 3D stacked semiconductor structure of FIG. 2 is taken along similarly as the cross-sectional line AA' of FIG. 1. The 3D stacked semiconductor structure 2 comprises several oxide layers 231 and conductive layers 233 alternately arranged as a stack, at least a contact hole 235 formed vertically to the oxide layers 231 and the conductive layers 233, an insulator 236 formed at the sidewall of the contact hole 235, a conductive material in the contact hole 235, and silicide 240 at least formed two end portions of the corresponding conductive layer 233 to which the contact hole 235 extends. The contact hole 235 extends to one of the conductive layers 233, and the exact position depends on the design requirements of the practical applications. As shown in FIG. 2, the contact hole 235 extends to the second conductive layer 233 (e.g. the corresponding conductive layer herein is the second conductive layer 233). A conductor 238 is the conductive material filled in the contact hole 235. The corresponding conductive layer 233, to which the contact hole 235 extends, has higher conductivity than other conductive layers 233. Material examples of the conductive layers 233 include undoped polysilicon.

In this embodiment, edges of all the conductive layers 233 (including the second conductive layer 233 which the contact hole 235 extends to) comprise the silicide 240, or salicide. Although the silicide 240 illustrated in FIG. 2 are positioned at two ends of the conductive layers 233, they are actually formed at the whole edges of the conductive layers 23 (please refer to FIG. 1 as a reference of the perspective view). Examples of the silicide 240 include cobalt silicide, tungsten silicide, and other metal silicide with low resistance. In one embodiment, the conductive layers 233 other than the second conductive layers 233 may comprise undoped polysilicon besides the silicide 240. Also, the corresponding conductive layer 233 (i.e. the second conductive layer 233) may partially or entirely comprise a low-resistance conductive material besides the silicide 240. The low-resistance conductive material connects to the conductor 238 in the contact hole 235 to create a current path with low resistance, thereby increasing the transmission speed of electric signals. As shown in FIG. 2, the corresponding conductive layer 233 (i.e. the second conductive layer 233, which the contact hole 235 extends to) entirely comprises a low-resistance conducting substance 239 besides the silicide 240. Other conductive layers 233, such as the first, the third and the fourth conductive layers 233, could still comprise undoped polysilicon.

In this disclosure, materials of the conducting substance 239 and the conductor 238 in the contact hole 235 could be the same or different, which are not limited particularly. The material selections could be varied depending on the actual needs of practical applications. In one embodiment, materials of the conducting substance 239 and the conductor 238 could be the conductive materials having a resistance less than 500 ohm/per square. In one embodiment, materials of the conducting substance 239 and the conductor 238 are conductive materials with low resistance and easily to fill into the contact hole 235, such as heavily doped polysilicon, metals with high conductivity such as copper, tungsten, tungsten nitride (WN), aluminum (such as CVD Al), TiN/TaN, metallic compounds thereof, or the likes, formed by chemical vapor deposition (CVD) or electroplating deposition. The conductor 238 could be made of any of the low-resistance materials, such as low-resistance metals, low-resistance metallic compounds, or low-resistance semiconductor (e.g. highly doped Si or Ge) . . . etc. Material of the conductor 238 could be selected according to the actual needs of the practical application.

Moreover, the insulator 236 formed at the sidewall of the contact hole 235 includes a body portion 2361 and an annular insulating portion 2363. The body portion 2361 is vertically disposed at the sides of the contact hole 235 to isolate the conductor 238 from part of the oxide layers 231 and the conductive layers 233, which mean that the oxide layers 231 and the conductive layer 233 above the corresponding conductive layer 233 (i.e. the second conductive layer 233) are insulated from the conductor 238 by the body portion 2361. The annular insulating portion 2363 is formed at outside of the body portion 2361 and connected to the body portion 2361. The annular insulating portion 2363 is also positioned at the conductive layer 233 above the corresponding conductive layer 233, e.g. the first conductive layer 233, to enhance the isolation of the non-corresponding conductive layer(s) 233. In other embodiment, if the contact hole 235 extends to the fourth conductive layer 233, the body portion 2361 of the insulator 236 would similarly extend and pass through the first, second and third oxide layers 231 and conductive layers 233, and the annular insulating portion 2363 of the insulator 236 would be positioned at the first, second and third conductive layers 233 to enhance the isolation condition of those conductive layers 233.

Figure 3A:
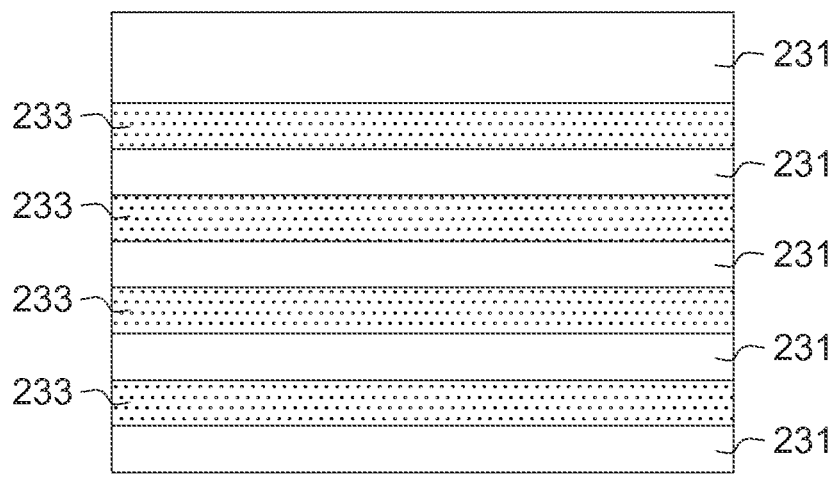
FIG. 3A-FIG. 3G illustrates a method for manufacturing a 3D stacked semiconductor structure of FIG. 2.
Figure 3B:
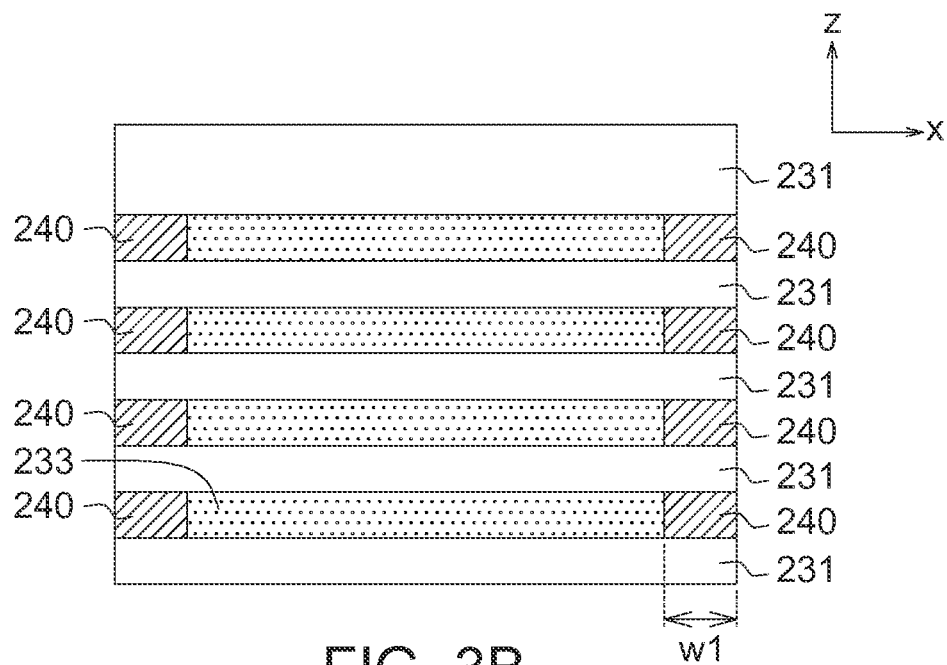

FIG. 3A-FIG. 3G illustrates a method for manufacturing a 3D stacked semiconductor structure of FIG. 2. As shown in FIG. 3A, forming a stack comprising several oxide layers 231 and conductive layers 233 arranged alternately. In one embodiment, material of the conductive layers 233 is undoped polysilicon. After pre-cleaning the stack, the silicide 240 is formed at two end portions of the conductive layers 233 (e.g., the right and left end portions), as shown in FIG. 3B. The width W1 of silicide 240, which extends along the x-direction of the conductive layer 233$n$, could be varied and adjusted according to design requirements. Meanwhile, the conductive layers 233 comprise the undoped polysilicon besides the silicide 240.

Figure 3C:
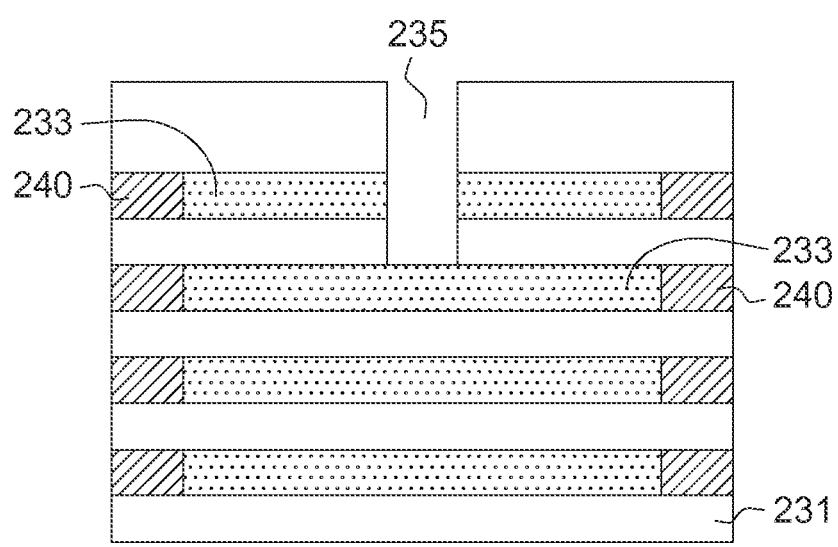
Figure 3D:
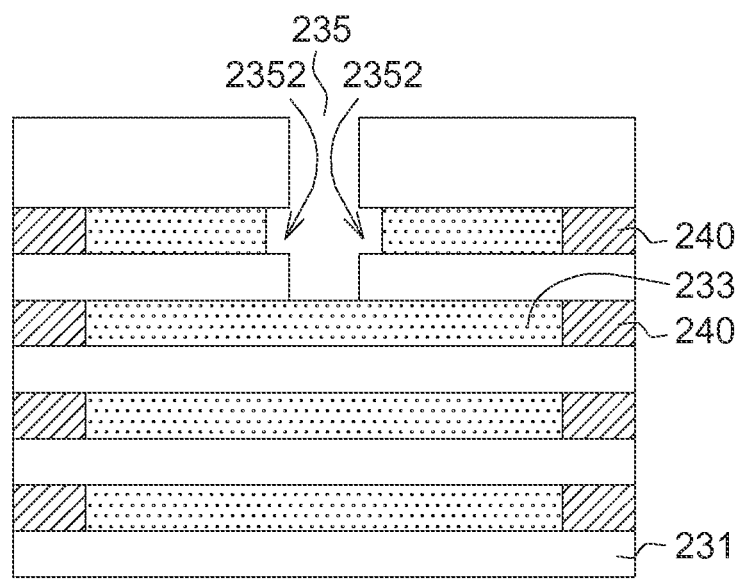

Then, at least a contact hole 235 is formed vertically to the oxide layers 231 and the conductive layers 233, and the contact hole 235 extends to the corresponding conductive layer 233, such as the second conductive layer 233 as shown in FIG. 3C. Next, the conductive layers 233 above the corresponding conductive layer 233 are pulled back to form the recesses 2352 relative to the oxide layers 231, as shown in FIG. 3D.

Figure 3E:
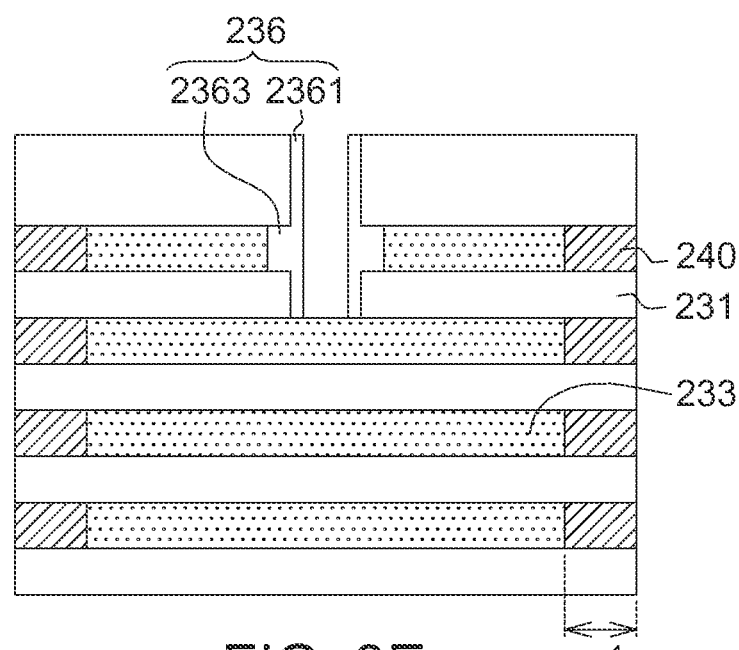

An insulating material is deposited on the stack formed by the oxide layers 231 and the conductive layers 233 to form an insulator 231 at the sidewall of the contact hole 235. The insulator 231 includes a body portion 2361 and an annular insulating portion 2362. The contact hole 235 is lined with the body portion 2361, while the insulating material fills up the recesses 2352 to form the annular insulating portion 2363. The insulating material on the top surface of the stack is then removed. FIG. 3E shown the structure after removing the insulating material on the top surface of the stack. In one embodiment, the deposited insulating material could be silicon nitride (SiN) or oxide, or other insulating material suitable for the processes.

Figure 3F:
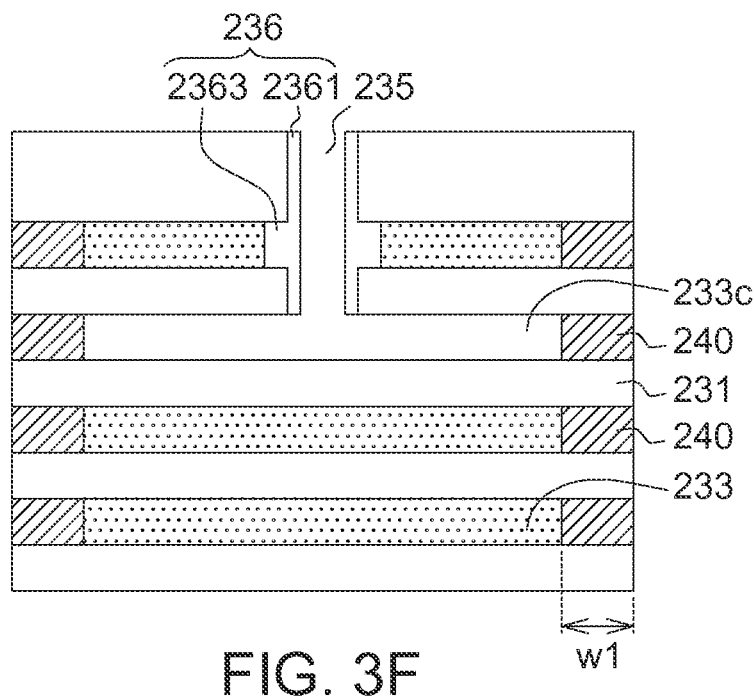

Next, at least one portion of the corresponding conductive layer 233 (which the contact hole 235 extends to) is removed to form a cavity 233c. In this embodiment, the corresponding conductive layer 233 is completely removed other than the silicide 240 (such as removing all of the undoped polysilicon of the corresponding conductive layer 233), as shown in FIG. 3F. Many different removal steps could be performed. For example, a wet etch or a chemical solution could be used to remove the corresponding conductive layer 233 through the contact hole 235, wherein the applicable chemical solution has high selectivity to the insulator 236, the oxide layers 231 and silicide 240.

Figure 3G:
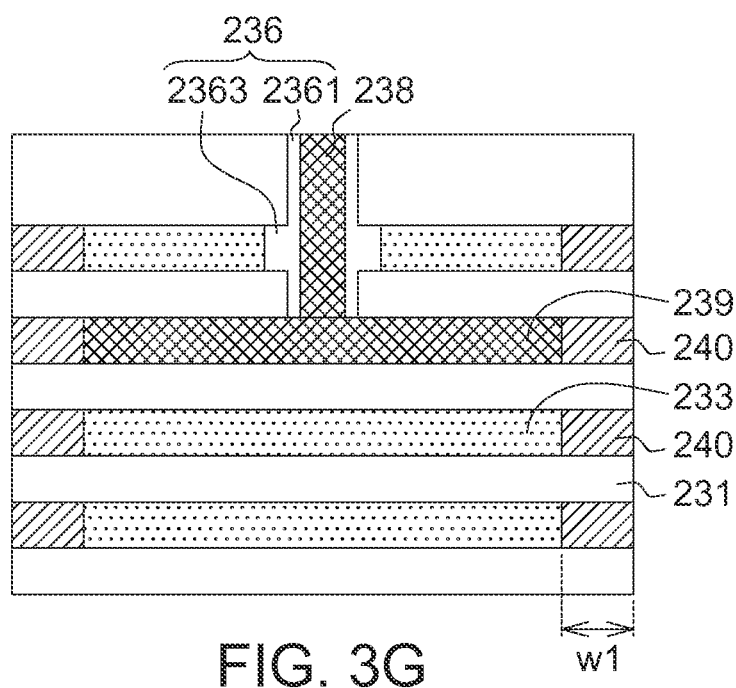

Next, a conductive material is formed to fill up the cavity 233c and the contact hole 235, thereby forming a conducting substance 239 in the cavity 233c and forming the conductor 238 in the contact hole 235, as shown in FIG. 3G. Examples of the conductive material include heavily doped polysilicon, metals with high conductivity such as copper and tungsten and the likes. The conductive material could be formed by chemical vapor deposition (CVD) or electroplating deposition. Moreover, same material could be adopted (and applied once) to form the conducting substance 239 and the conductor 238 in this embodiment. In FIG. 3G, connection between the conductor 238 in the contact hole 235 and the conducting substance 239 creates a current path with low resistance.

Although the structure of FIG. 2 illustrates that the portion of the corresponding conductive layer 233 (i.e. the conductive layer 233 to which the contact hole 235 extends) outside the silicide 240 is completely filled with the conducting substance 239 with low resistance, the disclosure is not limited thereto. It is still effectively to reduce the resistance of the structure and improve the performance of applied device that the low-resistance conductor is partially formed at the corresponding conductive layer 233 outside the silicide 240. The components of the following embodiments identical or similar to the components of FIG. 2 retain the same or similar reference numerals, and the details are not redundantly described.

Figure 4:
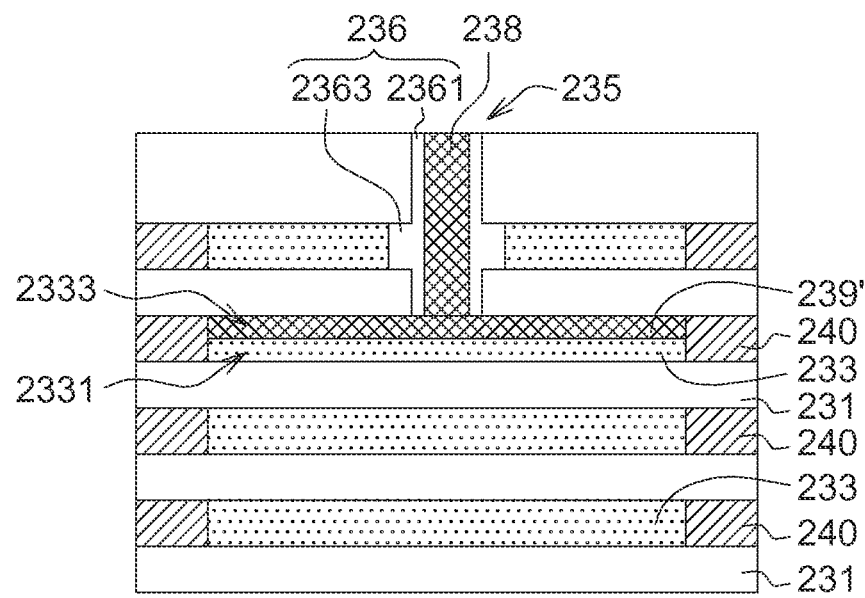
FIG. 4 is a cross-sectional view of another 3D stacked semiconductor structure according to the embodiment of the present disclosure.

FIG. 4 is a cross-sectional view of another 3D stacked semiconductor structure according to the embodiment of the present disclosure. As shown in FIG. 4, edges of the corresponding conductive layer 233 (i.e. the second conductive layer 233 which the contact hole 235 extends to) comprise silicide 240, and a middle portion between the silicide 240 of the corresponding conductive layer 233 comprises a bottom part 2331 and an upper part 2333 above the bottom part 2331. The upper part 2333 comprises a conducting substance 239' connecting the silicide 240 at edges. The bottom part 2331 is still made of material for forming original conductive layer 233, such as undoped polysilicon. Method for manufacturing the 3D stacked semiconductor structure of FIG. 4 is similar to the illustration of FIG. 3A-FIG. 3G. In the step of removing the corresponding conductive layer 233 (similar to the step of FIG. 3F) of this embodiment, the upper part 2333 of the corresponding conductive layer 233 which is close to the contact hole 235 is removed, thereby forming a lateral channel to expose at least parts of the silicide 240 at edges of the corresponding conductive layer. Then, the conductive material is filled up the lateral channel to form the conducting substance 239', and the conducting substance 239' contacts the silicide 240.

Figure 5:
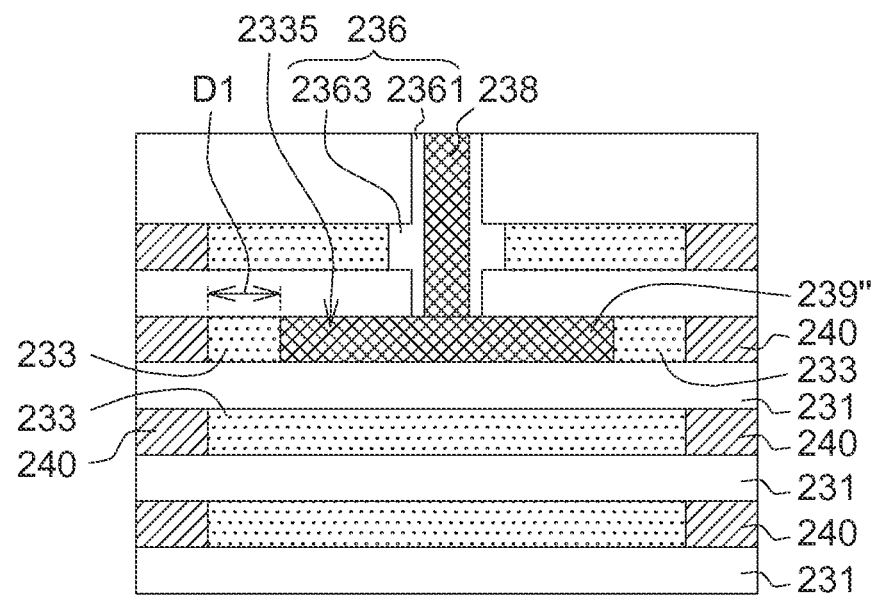
FIG. 5 is a cross-sectional view of a yet another 3D stacked semiconductor structure according to the embodiment of the present disclosure.

FIG. 5 is a cross-sectional view of a yet another 3D stacked semiconductor structure according to the embodiment of the present disclosure. As shown in FIG. 5, edges of the corresponding conductive layer 233 (i.e. the second conductive layer 233 which the contact hole 235 extends to) also comprise silicide 240, and a central part of 2335 filled with the conducting substance 239". The conducting substance 239". is spaced apart from the silicide 240 (with a distance D1, and by the undoped polysilicon, for example). Method for manufacturing the 3D stacked semiconductor structure of FIG. 5 is similar to the illustration of FIG. 3A-FIG. 3G. In the step of removing the corresponding conductive layer 233 (similar to the step of FIG. 3F) of this embodiment, the central part 2335 of the corresponding conductive layer 233 which is close to the contact hole 235 is removed, thereby exposing surfaces of the oxide layers 231 at two opposite sides (above and beneath) of the corresponding conductive layer 233. Then, the conductive material is filled up the central part 2335 to form the conducting substance 239". Although the conducting substance 239" doesn't directly contact the silicide 240, it still effectively reduces the resistance of the whole structure and enhances the device performance in the application. Furthermore, in one embodiment, the contact hole 235 would have a rectangular opening, which is constructed to reduce the distance (in the x-direction) between the conductor 238 and the silicide 240.

Figure 6:
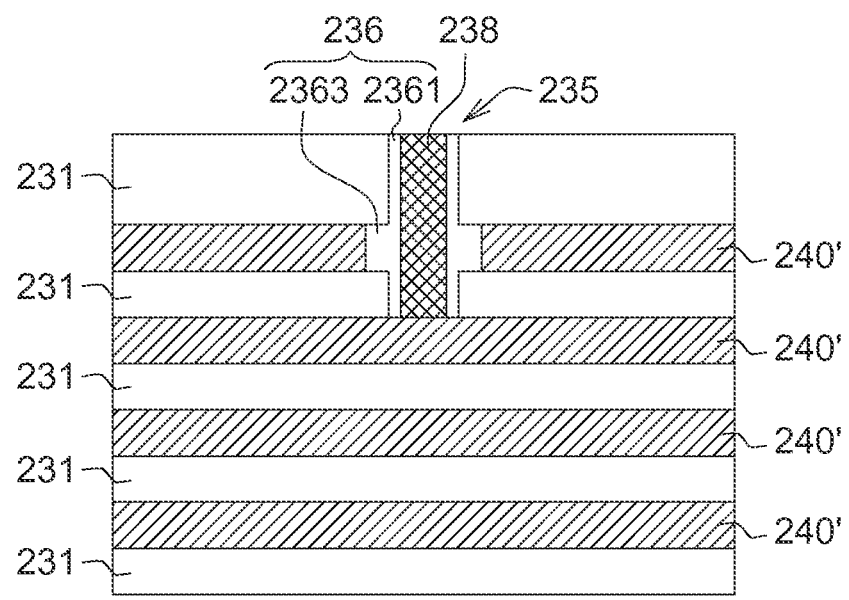
FIG. 6 is a cross-sectional view of a further 3D stacked semiconductor structure according to the embodiment of the present disclosure.

According to the embodiments above, the silicide 240 is formed before the formations of the conductor 238 in the contact hole 235 and the conducting substance 239/239'/239" in the corresponding conductive layer 233. However, the disclosure is not limited thereto. Formations of the contact hole 235 and the conductor 238 could be performed before forming the silicide. FIG. 6 is a cross-sectional view of a further 3D stacked semiconductor structure according to the embodiment of the present disclosure. Please also refer to FIG. 3A, FIG. 3C, FIG. 3D and FIG. 3E, for illustrations of forming the stack of oxide layers 231 and conductive layers 233, forming the contact hole 235, and forming the insulator 236. After forming the insulator 236, a conductive material is filled in the contact hole 235 to form the conductor 238, and the silicide 240' is then formed in the corresponding conductive layer 233. As shown in FIG. 6, the conductive layers 233 are entirely replaced by the silicide 240'. However, the disclosure is not limited thereto. In the practical applications, the silicide 240' could be partially formed at the conductive layers 233, and the resistance of the whole structure is still effectively reduced. The proportion of silicide 240' and original material of conductive layer 233 (such as undoped polysilicon) could be adjusted and varied according to the requirements of practical applications. Because the silicide 240' of FIG. 6 is formed later, deposition oxide, deposition nitride and thermal oxide could be adopted for being the material of the insulator 236.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A 3D stacked semiconductor structure, comprising:
   a plurality of oxide layers and a plurality of conductive layers arranged alternately;
   at least a contact hole formed vertically to the oxide layers and the conductive layers, and the contact hole extending to and stopping at one of the conductive layers;

a cavity, communicating with the contact hole, formed at the corresponding conductive layer by removing at least one portion of the corresponding conductive layer;

a conductor formed in the contact hole and the cavity, and the conductor electrically connecting the corresponding conductive layer to which the contact hole extends; and an insulator formed at sidewall of the contact hole;

wherein the corresponding conductive layer, to which the contact hole extends, has higher conductivity than other conductive layers.

2. The 3D stacked semiconductor structure according to claim 1, wherein edges of the corresponding conductive layer which the contact hole extends to comprise silicide.

3. The 3D stacked semiconductor structure according to claim 2, wherein the corresponding conductive layer comprises an undoped polysilicon besides the silicide.

4. The 3D stacked semiconductor structure according to claim 2, wherein a central part between the two end portions of the corresponding conductive layer is distanced form the silicide at the edges by an undoped silicon.

5. The 3D stacked semiconductor structure according to claim 1, wherein the corresponding conductive layer which the contact hole extends to entirely comprises silicide.

6. The 3D stacked semiconductor structure according to claim 2, wherein the silicide comprises cobalt silicide or tungsten silicide.

7. The 3D stacked semiconductor structure according to claim 1, wherein the conductor comprises heavily doped polysilicon, copper, tungsten, aluminum, TiN/TaN, or metallic compounds thereof.

8. The 3D stacked semiconductor structure according to claim 1, wherein the insulator comprises:

a body portion vertically disposed at the sidewall of the contact hole and isolating the conductor from part of the oxide layers and the conductive layers; and an annular insulating portion formed at outside the body portion and connected to the body portion, the annular insulating portion positioned at the conductive layers above the corresponding conductive layer.

9. The 3D stacked semiconductor structure according to claim 1, wherein the insulator comprises nitride, deposition oxide or thermal oxide.

10. The 3D stacked semiconductor structure according to claim 1, wherein a bottom surface of the conductor is positioned at said corresponding conductive layer to which the contact hole extends.

11. A method of forming 3D stacked semiconductor structure, comprising:

forming a plurality of oxide layers and a plurality of conductive layers arranged alternately;

forming at least a contact hole vertically to the oxide layers and the conductive layers, and the contact hole extending to and stopping at one of the conductive layers;

forming an insulator at sidewall of the contact hole;

removing at least one portion of the corresponding conductive layer to form a cavity communicating with the contact hole;

forming a conductor in the contact hole and the cavity, and the conductor electrically connecting the corresponding conductive layer to which the contact hole extends; and at least forming a silicide at one portion of corresponding conductive layer to which the contact hole extends, wherein the corresponding conductive layer, to which the contact hole extends, has higher conductivity than other conductive layers.

12. The method according to claim 11, wherein after forming the oxide layers and the conductive layers alternately, the method comprises:

forming the silicide at edges of the conductive layers;

forming the contact hole vertically to the oxide layers and the conductive layers, and the contact hole extending to said corresponding conductive layer;

pulling back the conductive layers above the corresponding conductive layer, and the conductive layers above the corresponding conductive layer having a plurality of recesses relative to the oxide layers;

depositing an insulating material on a stack formed by the oxide layers and the conductive layers to form the insulator at the sidewall of the contact hole, and the insulating material filling into the recesses to form an annular insulating portion; and removing the insulating material on a surface of the stack.

13. The method according to claim 11, wherein an upper part of the corresponding conductive layer which is close to the contact hole is removed to form the cavity, so as to form a lateral channel to expose at least parts of the silicide at two end portions of the corresponding conductive layer.

14. The method according to claim 11, wherein a central part of the corresponding conductive layer, and the central part exposes surfaces of the oxide layers at two opposite sides of the corresponding conductive layer.

15. The method according to claim 11, wherein the corresponding conductive layer is completely removed except the silicide.

16. The method according to claim 11, wherein step of removing the corresponding conductive layer is performed by a wet etch or a chemical solution through the contact hole.

17. The method according to claim 11, wherein after removing at least said portion of the corresponding conductive layer, a conductive material fills up the cavity and the contact hole, thereby forming a conducting substance in the cavity and forming the conductor in the contact hole.

18. The method according to claim 11, wherein after forming the oxide layers and the conductive layers alternately, the method comprises:

forming the contact hole vertically to the oxide layers and the conductive layers, and the contact hole extending to said corresponding conductive layer;

pulling back the conductive layers above the corresponding conductive layer, and the conductive layers above the corresponding conductive layer having a plurality of recesses relative to the oxide layers;

depositing an insulating material on a stack formed by the oxide layers and the conductive layers to form the insulator at the sidewall of the contact hole, and the insulating material filling into the recesses to form an annular insulating portion;

removing the insulating material on a surface of the stack; and forming the silicide entirely at the corresponding conductive layer to which the contact hole extends.

19. The method according to claim 11, wherein the conductor comprises heavily doped polysilicon, copper, tungsten, aluminum, TiN/TaN, or metallic compounds thereof.

20. The method according to claim 11, wherein the silicide comprises cobalt silicide or tungsten silicide.

21. The method according to claim 11, wherein a bottom surface of the conductor is positioned at said corresponding conductive layer to which the contact hole extends.

* * * * *